United States Patent
Kim et al.

(10) Patent No.: US 9,315,920 B2
(45) Date of Patent: Apr. 19, 2016

(54) GROWTH SUBSTRATE AND LIGHT EMITTING DEVICE COMPRISING THE SAME

(71) Applicant: LG ELECTRONICS INC., Seoul (KR)

(72) Inventors: Hyunggu Kim, Seoul (KR); Hwankuk Yuh, Seoul (KR); Hyosang Yu, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 26 days.

(21) Appl. No.: 14/319,976

(22) Filed: Jun. 30, 2014

(65) Prior Publication Data

US 2015/0001556 A1    Jan. 1, 2015

(30) Foreign Application Priority Data

Jul. 1, 2013  (KR) .................. 10-2013-0076485

(51) Int. Cl.
| | |
|---|---|
| *H01L 27/15* | (2006.01) |
| *H01L 29/26* | (2006.01) |
| *H01L 31/12* | (2006.01) |
| *H01L 33/00* | (2010.01) |
| *C30B 29/40* | (2006.01) |
| *C30B 25/18* | (2006.01) |
| *C30B 25/04* | (2006.01) |
| *H01L 21/02* | (2006.01) |
| *H01L 33/16* | (2010.01) |
| *H01L 33/20* | (2010.01) |
| *H01L 33/12* | (2010.01) |

(52) U.S. Cl.
CPC .............. *C30B 29/403* (2013.01); *C30B 25/04* (2013.01); *C30B 25/183* (2013.01); *H01L 21/0237* (2013.01); *H01L 21/0254* (2013.01); *H01L 21/0262* (2013.01); *H01L 21/02433* (2013.01); *H01L 21/02458* (2013.01); *H01L 21/02516* (2013.01); *H01L 21/02639* (2013.01); *H01L 21/02647* (2013.01); *H01L 33/007* (2013.01); *H01L 33/12* (2013.01); *H01L 33/16* (2013.01); *H01L 33/20* (2013.01); *Y10T 428/24355* (2015.01)

(58) Field of Classification Search
USPC ......................... 257/40–79; 428/141; 117/95
See application file for complete search history.

(56) References Cited

U.S. PATENT DOCUMENTS

2014/0183579 A1*  7/2014  Kaeding ............... H01L 33/16
                                                              257/94

\* cited by examiner

*Primary Examiner* — Telly Green
(74) *Attorney, Agent, or Firm* — Birch, Stewart, Kolasch & Birch, LLP

(57) ABSTRACT

A growth substrate including a substrate having a growth surface including a plurality of steps inclining in a first direction; a first layer disposed on the growth surface, the first layer including an A-plane or an M-plane in an upper part thereof, a plurality of protrusions having an inclined surface on an upper surface thereof, and nitride; a mask layer including a dielectric material and having at least a portion disposed on the protrusions; and a second layer disposed on the mask layer and including nitride.

10 Claims, 14 Drawing Sheets

GROWTH SUBSTRATE AND LIGHT EMITTING DEVICE COMPRISING THE SAME

CROSS-REFERENCE TO RELATED APPLICATION

This application claims priority under 35 U.S.C. §119 to Korean Application No. 10-2013-0076485 filed on Jul. 1, 2013, whose entire invention is hereby incorporated by reference.

BACKGROUND OF THE INVENTION

1. Field of the Invention

The present invention relates to a growth substrate and a light emitting device comprising the same.

2. Background of the Invention

A light emitting diode (LED) converts an electrical signal into light using characteristics of compound semiconductors. LEDs are now being applied to devices such as home appliances, remote controls, electronic signboards, displays, a variety of automatic appliances and the like and their application range continues to expand.

A light emitting device generally dissipates energy, in particular, in heat or light form corresponding to an energy gap between a conduction band and a valence band through a combination of electrons in an n-layer with holes in a p-layer by applying a forward voltage. Here, a device emitting the energy in light form is an LED.

A nitride semiconductor generally has a high thermal stability and wide band-gap energy, and thus attracts great interest in development of optical elements and high output electronic elements. Specifically, blue, green and UV light emitting devices and the like using nitride semiconductors are commercially available in a broad range of applications.

A light emitting device may be distorted due to a lattice mismatch between a substrate and a semiconductor layer or a plurality of semiconductor layers. Accordingly, there is a need for solving lattice mismatch while maintaining optical and electrical properties.

A gallium nitride material used for manufacturing blue light emitting diodes has a hexagonal crystal system (Wurzit) structure and a thin film is generally grown along a c-axis crystal direction. The most general reason for growing the thin film along the c-axis crystal direction is that horizontal growth of a gallium nitride thin film is easy in this crystal direction and high crystal qualities associated with reduction in defects such as dislocation are obtained.

When a hetero-thin film is grown on the substrate, piezoelectric polarization may be generated. Such a polarization produces an internal field and thereby deforms an active layer energy band structure. In order to solve this problem, there is a need for manufacturing light emitting diodes using a material having a crystal structure in a nonpolar direction causing no polarization phenomenon.

SUMMARY OF THE INVENTION

Accordingly, an object of the present invention is to address the above-noted and other problems.

To achieve these and other advantages and in accordance with the purpose of the present invention, as embodied and broadly described herein, the present invention provides in one aspect a growth substrate including a substrate having a growth surface including a plurality of steps inclining in a first direction; a first layer disposed on the growth surface, the first layer including an A-plane or an M-plane in an upper part thereof, a plurality of protrusions having an inclined surface on an upper surface thereof, and nitride; a mask layer including a dielectric material and having at least a portion disposed on the protrusions; and a second layer disposed on the mask layer and including nitride. The present invention also provides a corresponding light emitting device.

In another aspect, the present invention provides a method for manufacturing a growth substrate, and which includes forming a growth surface on an upper surface of a substrate of a hexagonal system such that the upper surface has an angle of inclination from an R plane; forming a first layer on the growth surface, including nitride and a plurality of protrusions having an inclined surface on an upper surface thereof; forming a mask layer including a dielectric material and having at least a portion disposed on the protrusions; and forming a second layer on the mask layer and including nitride.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF EMBODIMENTS OF THE INVENTION

Reference will now be made in detail to embodiments, examples of which are illustrated in the accompanying drawings. Hereinafter, embodiments will be described in more detailed with reference to the drawings.

Figure 1:
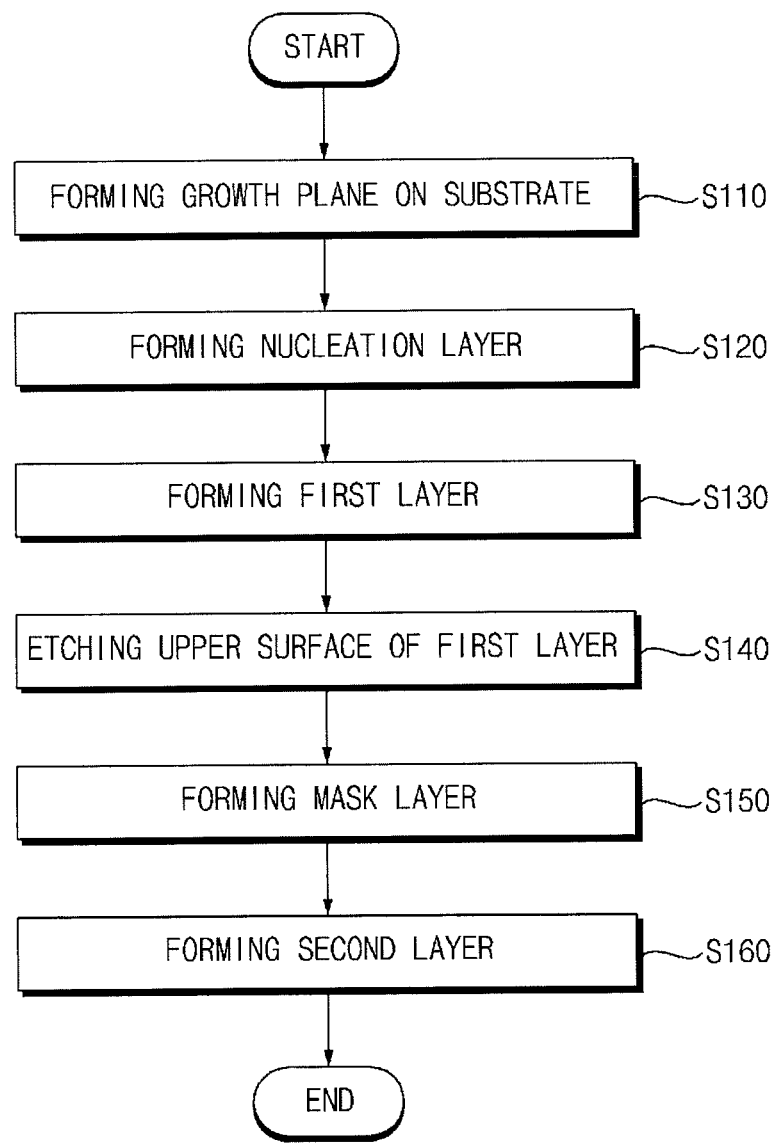
FIG. 1 is a flowchart illustrating a method for manufacturing a growth substrate according to the present invention.

FIG. 1 is a flowchart illustrating a method for manufacturing a growth substrate according to an embodiment. Referring to FIG. 1, the method includes forming a growth surface on a substrate (S110), forming a nucleation layer on the growth surface (S120), forming a first layer on the nucleation layer (S130), etching an upper surface of the first layer (S140), forming a mask layer on the first layer (S150) and forming a second layer (S160).

The forming of the growth surface (S110) forms a plurality of steps having an inclination in a first direction on the upper surface of the substrate. The forming of the mask layer (S150) comprises forming a nano-porous structure including a plurality of grooves through which the mask layer is penetrated in a vertical direction.

The forming of the second layer (S160) forms the second layer overlapped with the mask layer horizontally. The forming of the second layer (S160) includes forming an air void between the second layer and the mask layer.

Respective steps of the method for manufacturing a growth substrate will be described with reference to respective drawings below.

Figure 2:
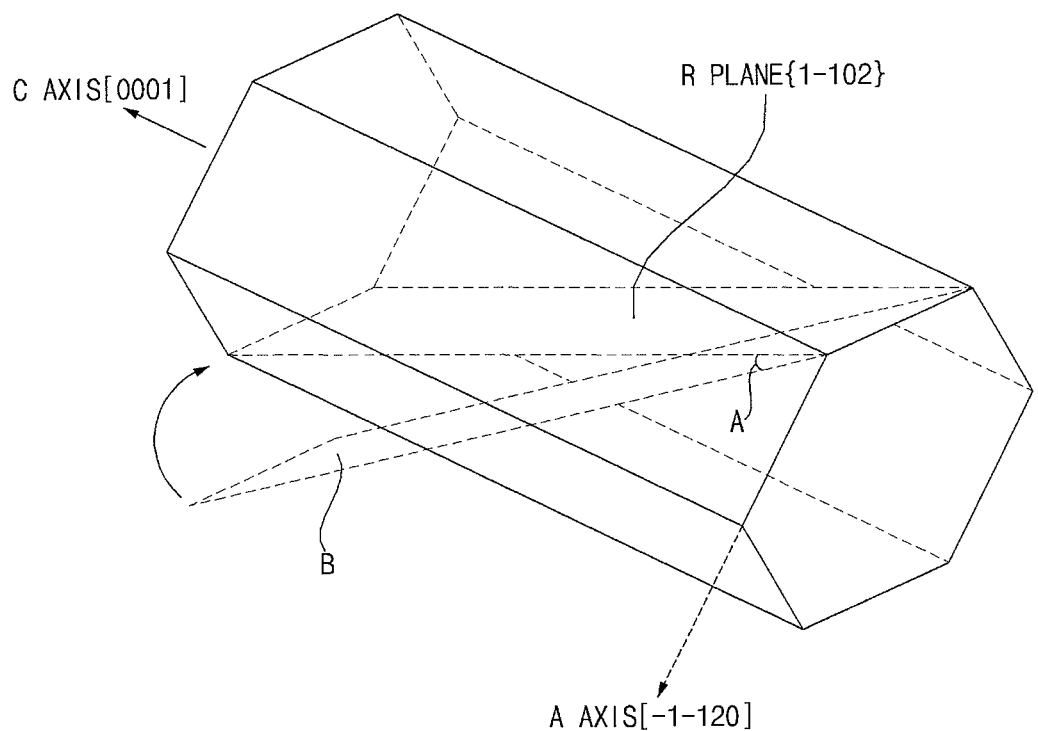
FIG. 2 is a view illustrating a correlation between the upper surface of the substrate and an R plane of a hexagonal system according to the present invention.
Figure 3:
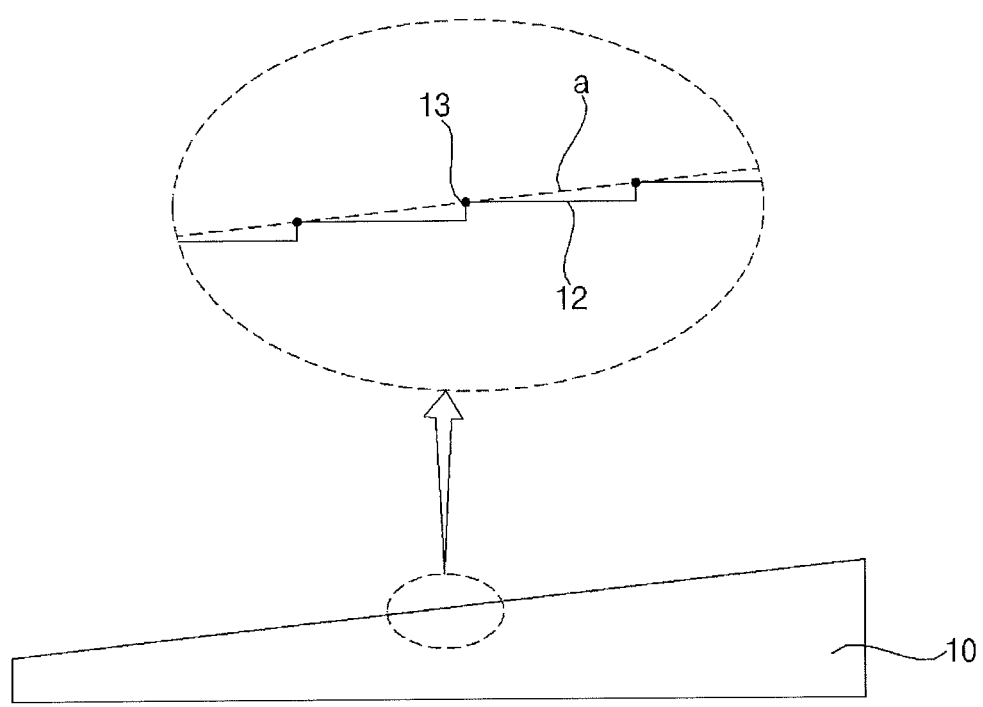
FIG. 3 is a sectional view illustrating a configuration of the upper surface of the substrate according to the present embodiment.

In particular, FIG. 2 is a view illustrating a correlation between an upper surface of a substrate and an R plane of a hexagonal system according to an embodiment, and FIG. 3 is a sectional view illustrating a shape of the upper surface of the substrate according to the embodiment of FIG. 2.

Referring to FIGS. 2 and 3, the upper surface of the substrate 10 has an inclination with respect to an R plane of a hexagonal system. FIG. 2 is a reference view illustrating crystal structures of the substrate and a nitride semiconductor layer, which shows planes and axes of the hexagonal system.

In the embodiment, the growth substrate is used to grow a nonpolar nitride semiconductor. The nonpolar nitride semiconductor means a crystalline material which does not cause a polarization phenomenon in a growth direction and may be implemented by growing in a direction rotated 90 degrees from a c-plane.

The nitride semiconductor may be a nitrogen-containing substance. For example, the nitride semiconductor may be a nitrogen-containing substance such as gallium nitride (GaN), indium gallium nitride (InGaN), aluminum gallium nitride (AlGaN), aluminum indium gallium nitride (AlInGaN), indium nitride (InN) or aluminum nitride (AlN).

The nitride semiconductor layer and alloys thereof are the most stable in a hexagonal crystal system structure (in particular, a hexagonal wurzite structure). Such a crystal structure is represented by three basic axes [$a_1$, $a_2$ and $a_3$] which are rotationally symmetric to one another at 120 degrees and are vertical to a C-axis [0001], as shown in FIG. 2.

A crystal direction index is represented by [0000], a family index of crystal direction indexes equivalent to a certain crystal direction index is represented by <0000>, a plane direction index is represented by (0000), and a family index of crystal direction indexes equivalent to a certain plane direction index is represented by {0000}.

The substrate and the nitride semiconductor layer may have a hexagonal crystal structure. That is, the substrate may be formed of a material having a hexagonal crystal structure, for example, sapphire ($Al_2O_3$), SiC, GaAs, GaN, or ZnO.

When a nitride semiconductor layer is grown on the substrate having the crystal structure, and the nitride semiconductor layer is grown along an R plane {1 –1 0 2} direction, a nitride thin film is easily grown and is stable at a high temperature. For this reason, the substrate is generally used as a substrate for growing nitride.

FIG. 2 illustrates an R plane {1 –1 0 2} of a hexagonal system. When an A-plane nitride semiconductor is grown on the R plane of the hexagonal system, a lattice constant difference of about 16% is present in an m-axis [1-100] direction, and a lattice constant difference of about 1% is present in a c-axis [0 0 0 1] direction, and crystal defects and structural anisotropy may be present due to the lattice constant difference. The structural anisotropy may be caused by difference in crystal growth speeds between c-axis [0 0 0 1] direction and m-axis [1 –1 0 0] direction.

In an embodiment of the present invention, the substrate 10 may have a plurality of steps on an upper surface thereof. The upper surface of the substrate 10 may be etched such that the upper surface has an inclination in a first direction. The substrate 10 may have an inclination formed by the inclination plane of the upper surface provided in the first direction, and the R plane of the hexagonal system. The first direction may be a C-axis direction of the hexagonal system.

Referring to FIG. 3, a line connecting ends of the steps formed on the upper surface of the substrate 10 may be a straight line. The steps formed on the upper surface of the substrate 10 may be uniform in size. Distances in a short axis direction between the steps formed on the upper surface of the substrate 10 may be uniform.

Referring to FIGS. 2 and 3, a virtual line "a" connecting ends 13 of the steps 12 formed on the upper surface of the substrate 10 and the R plane of the hexagonal system may form an angle A. The R plane of the hexagonal system and a growth surface (B of FIG. 2) of the substrate 10 may form an angle A.

When the growth surface of the substrate 10 and the R plane of the hexagonal system form an inclination, formation of irregularities on an upper surface of the second layer formed on the first layer is minimized. When a semiconductor device is grown on the second layer, generation of defects is minimized.

When the growth surface of the substrate 10 and the R plane of the hexagonal system form an inclination, the second layer is homogeneously formed between a plurality of mask layers and propagation of defects generated at the interface between the first layer and the substrate 10, to the upper surface of the second layer is minimized.

A variety of defects such as hillocks, mounds, cracks and gaps may be generated at the interface between the first layer and the substrate 10, but the probability of the defects may be considerably reduced when the growth surface of the substrate 10 forms an inclination with respect to the R plane of the hexagonal system.

The angle A formed by the virtual line "a" connecting the ends 13 of the steps 12 of the upper surface of the substrate 10 and the R plane of the hexagonal system may be 0.2° to 0.4°. When the angle A is 0.2° to 0.4°, the first layer and the second layer are easily grown in a horizontal direction.

When the angle A formed in a positive (+) direction by the virtual line "a" connecting ends 13 of the steps 12 of the upper surface of the substrate 10, and the R plane of the hexagonal system is 0.2° to 0.4°, growth of the second layer between a plurality of protrusions of the first layer is easy and generation of defects is thus minimized.

When the angle A formed in a positive (+) direction by the virtual line "a" connecting the ends 13 of the steps 12 of the upper surface of the substrate 10 and the R plane of the hexagonal system is smaller than 0.2° or greater than 0.4°, many defects may be formed on the surface of the second layer due to difference in lattice constant between the substrate 10 and the semiconductor layer formed thereon. The virtual line "a" connecting ends 13 of the steps 12 of the upper surface of the substrate 10 may form the angle A in the positive (+) direction with respect to the R plane of the hexagonal system.

The steps 12 formed on the upper surface of the substrate 10 may be formed of atoms of the material composing the substrate 10. For example, the steps 12 may be atomic steps formed on a basis of atoms composing the substrate 10. A height of the steps 12 may be similar to a radius of atoms composing the substrate 10.

The steps 12 are formed on the upper surface of the substrate 10. A width between the steps of the inclination direction may be 30 to 200 nm. For example, the steps 12 formed on the upper surface of the substrate 10 have a width in a direction vertical to the A axis, of 30 to 200 nm.

For example, when the angle of inclination A formed by the virtual line "a" connecting the ends 13 of the steps 12 of the upper surface of the substrate 10 and the R plane of the substrate of the hexagonal system is smaller than 0.2° or is greater than 0.4°, the steps 12 have a width in a direction vertical to the A axis, of 30 to 200 nm. When the width is 47 to 186 nm, generation of defects is further reduced.

When gallium nitride is grown on the R plane of the hexagonal system, gallium nitride is anisotropically grown to a thin film in a plane direction, in particular, a c-plane direction, unlike c-plane gallium nitride isotropically grown in the plane direction.

Figure 4:
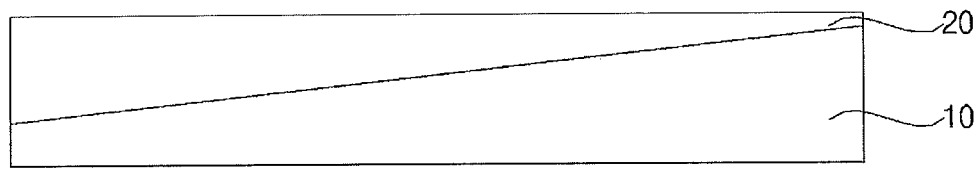
FIG. 4 is a sectional view illustrating a configuration in which a nucleation layer is formed on a substrate according to an embodiment of the present invention.

Next, FIG. 4 is a sectional view illustrating a configuration in which a nucleation layer is formed on a substrate according to an embodiment. Referring to FIG. 4, the nucleation layer 20 may be formed on the growth surface of the substrate 10 (S120). The nucleation layer 20 is formed on the growth surface of the substrate 10 using a nitride semiconductor grown at a low or high temperature, such as gallium nitride (GaN), aluminum nitride (AlN), or aluminum gallium nitride (AlGaN).

The nucleation layer 20 is formed on the growth surface of the substrate 10 and has an inclination from the R plane of the hexagonal system, but the embodiment of the present invention is not limited thereto. The nitride semiconductor composing the nucleation layer 20 may form a nonpolar or semipolar semiconductor layer. The nucleation layer 20 may be formed using an a-plane or m-plane nitride semiconductor.

The nitride semiconductor comprising the nucleation layer 20 may be formed in a growth apparatus such as metal organic chemical vapor deposition (MOCVD) or hydride vapor phase epitaxy (HVPE) apparatus. An example of nitride semiconductor growth using MOCVD will be given below.

The nucleation layer 20 preferably has a thickness of 10 to 2,000 nm.

In addition, the nucleation layer 20 is grown under the conditions of a temperature ranging from 400 to 1,200° C., a ratio of a Group V substance to a Group III substance, i.e., V/III, ranging from 500 to 10,000, and a growth pressure ranging from 50 to 200 mbar. The method may further include annealing the sapphire substrate 10 under an ammonia ($NH_3$) atmosphere before forming the nucleation layer.

Figure 5:
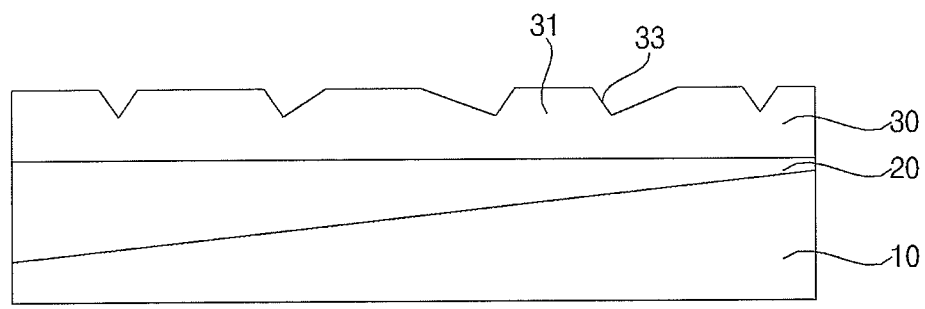
FIG. 5 is a sectional view illustrating a configuration in which a first layer is formed on the nucleation layer according to an embodiment of the present invention.

FIG. 5 is a sectional view illustrating a configuration in which a first layer is formed on the nucleation layer according to an embodiment. Referring to FIG. 5, a first layer 30 including a nitride semiconductor may be formed on the nucleation layer 20 (S130).

The first layer 30 may be grown under growth conditions including a growth temperature of 900 to 1,200° C., a growth pressure of 50 to 300 mbar, and a V/III ratio of 50 to 5,000. In the method for manufacturing a growth substrate in the embodiment, growth may be stopped under the condition that the upper surface of the first layer 30 maintains an island-shape.

The growth of the first layer 30 into a thin film may be stopped when protrusions 31 are disposed on the upper surface of the first layer 30. The protrusions 31 may have an inclined surface 33. The upper surface of the first layer 30 may include both a flat surface and an inclined surface. The first layer 30 may have the same crystal plane as the nucleation layer 20. The first layer 30 may have a crystal plane such as a-plane or m-plane.

Figure 6:
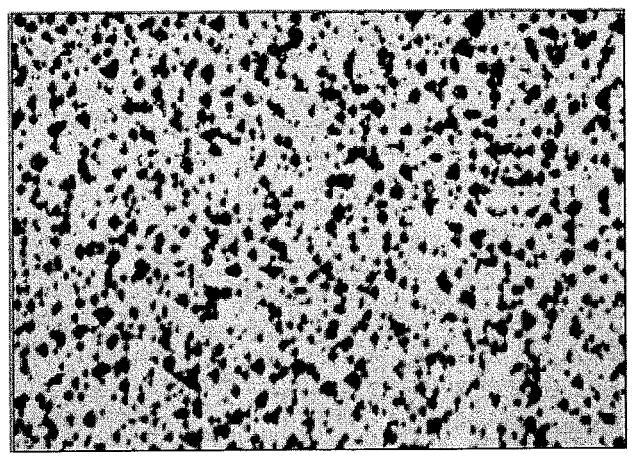
FIG. 6 is a micrograph showing an outer appearance of a surface of the first layer having protrusions according to an embodiment of the present invention.

FIG. 6 is a micrograph showing an outer appearance of a surface of the first layer having protrusions according to an embodiment. Referring to FIG. 6, a micrograph of an exposed portion of an upper surface of the first layer 30 having protrusions 31 is seen.

The method for manufacturing a growth substrate according to the embodiment may include etching the upper surface of the first layer 30 (S140). When the upper surface of the first layer 30 is etched, a size of the protrusions 31 may be increased. When the upper surface of the first layer 30 is etched, the inclined surface 33 of the protrusions 31 may be further widened.

Figure 7:
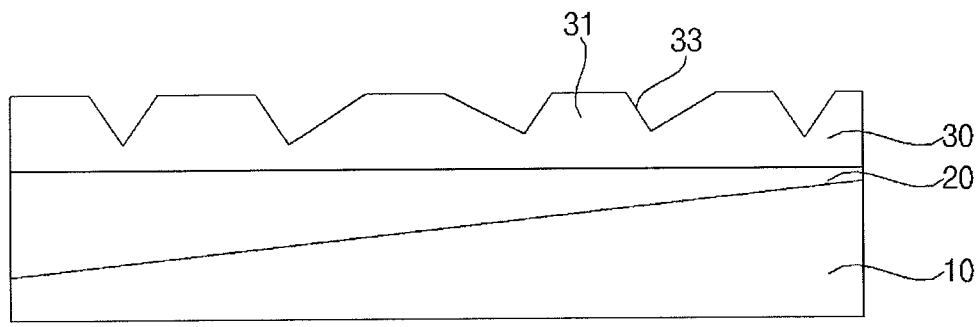
FIG. 7 is a sectional view illustrating a configuration in which the surface of the first layer is etched according to an embodiment of the present invention.
Figure 8:
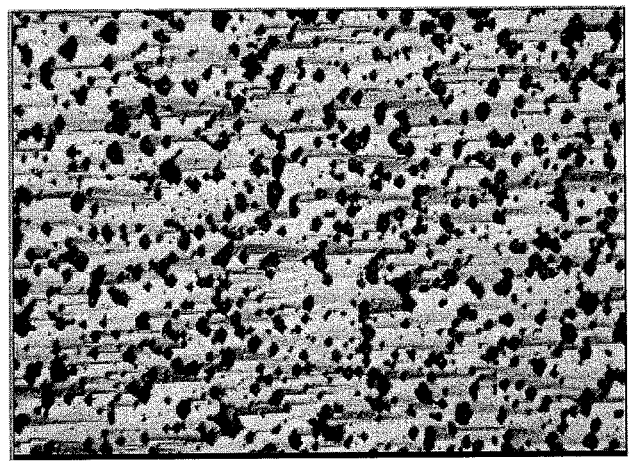
FIG. 8 is a micrograph showing an outer appearance of the etched surface of the first layer according to the present embodiment.

FIG. 7 is a sectional view illustrating a configuration in which the surface of the first layer is etched according to an embodiment, and FIG. 8 is a micrograph showing an outer appearance of the etched surface of the first layer according to the embodiment of FIG. 7.

Referring to FIGS. 7 and 8, as compared to that shown in FIG. 5, the inclined surface 33 of the protrusions 31 on the surface of the etched first layer may be further widened. A ratio of an area of the protrusions 31 on the surface of the etched first layer may be increased. In another embodiment, the ratio of protrusions may be increased by changing growth conditions without etching the surface of the first layer.

Such an etching process may be performed inside or outside of a MOCVD growth apparatus and using a dry or wet etching method. The etching may be performed using $SiH_4$, $Cl_2$, $BCl_3$, KOH, phosphoric acid, sulfuric acid, hydrochloric acid or the like.

When the protrusions 31 having the inclined surface 33 are present, the direction in which crystal defects are propagated may be changed by the inclined surface 33. For example, the protrusions 31 may bend or convert the direction in which defects such as threading dislocations are propagated. As a result, defects may be joined or decayed and the density of defects may thus be decreased. A ratio of the protrusions 31 having the inclined surface 33 on the upper surface of the first layer 30, namely, a ratio of the inclined surface to the flat surface may be used to decrease defects upon thin film growth.

Figure 9:
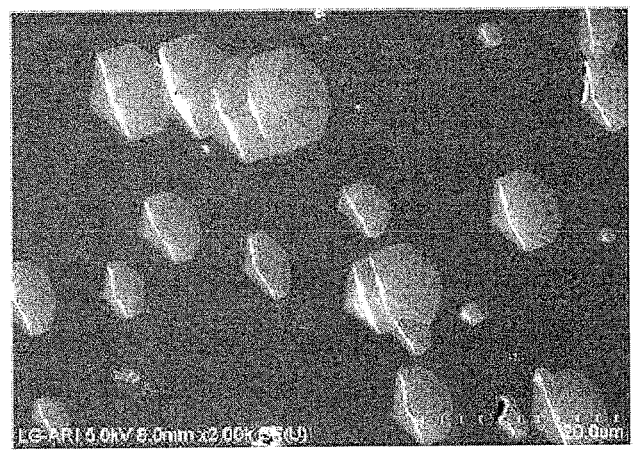
FIGS. 9 to 12 are micrographs showing surface morphology under growth conditions according an embodiment.
Figure 10:
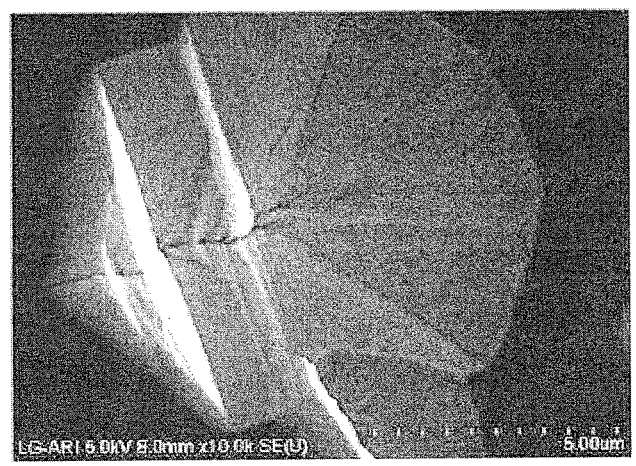
Figure 11:
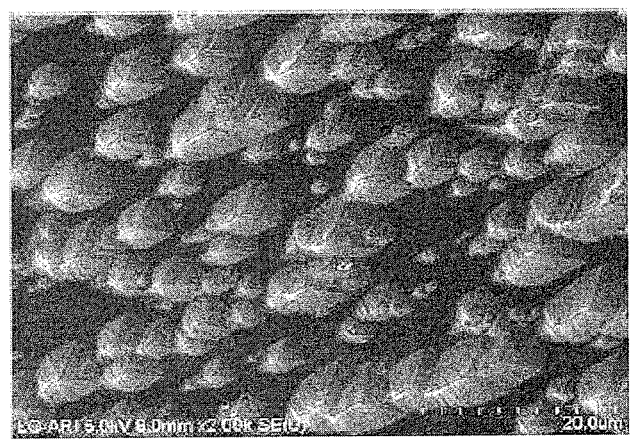
Figure 12:

Next, FIGS. 9 to 12 are micrographs showing surface morphology under growth conditions according an embodiment. In particular, FIGS. 9 to 12 show surface morphology of the first layer 30 under growth conditions. FIG. 10 is an enlarged image of FIG. 9, and FIG. 12 is an enlarged image of FIG. 11.

When the growth conditions include the V/III ratio being 200, a density of pits may be decreased, as shown in FIGS. 9 and 10, and when the V/III ratio is a relatively high value, i.e., 500, a density of pits may be increased, as shown in FIGS. 11 and 12.

An absolute value of the V/III ratio may be changed according to the size and type of reactor used to grow a nitride semiconductor, but the behavior of pit density depending on the level of V/III ratio has been described above. That is, as the V/III ratio increases, the pit density tends to increase.

Figure 13:
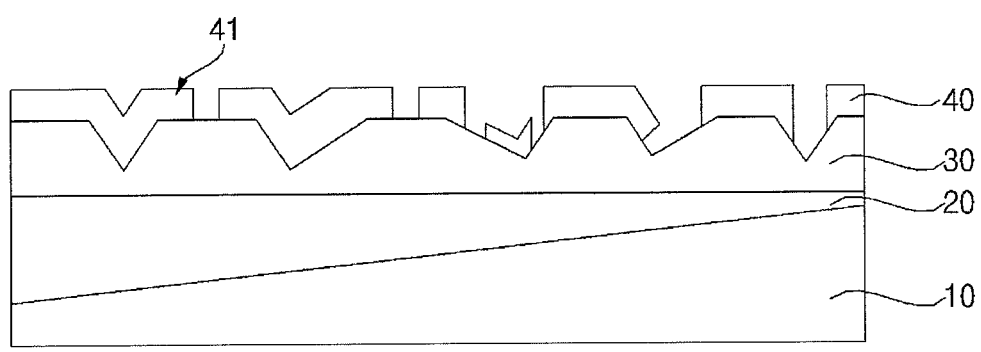
FIG. 13 is a sectional view illustrating a configuration in which a mask layer is formed on the first layer according to an embodiment of the present invention.

Next, FIG. 13 is a sectional view illustrating a configuration in which a mask layer is formed on the first layer according to an embodiment. Referring to FIG. 13, in the method for manufacturing a growth substrate according to the embodiment, a mask layer 40 having a nano-porous structure may be formed on the first layer 30 having the protrusions 31 (S150).

The mask layer 40 may be formed so that unit structures 41 are irregularly disposed on the first layer 30 or voids are disposed between the unit structures 41. The mask layer 40 may have an irregular porous structure. The mask layer 40 has a nano-porous structure so that the first layer contacts with the second layer. The mask layer 40 includes a groove having a groove portion a portion of the surface of the first layer 30 may contact with the second layer.

At least a portion of the mask layer 40 may be disposed on the protrusions 31. The mask layer 40 may have a thickness of several nanometers to several tens of nanometers. For example, the mask layer 40 has a thickness of 1 nm to 10 nm. When the thickness of the mask layer 40 is 1 nm to 10 nm, formation of a nano-porous structure is easier. The voids between the unit structures 41 of the mask layer 40 or a diameter of the voids may be 10 to 100 nm.

The mask layer 40 may include a dielectric material. For example, the mask layer 40 may include at least one substance of a silicon nitride film, an aluminum nitride film, a silicon oxide film, $Al_2O_3$, $TiO_2$, HfO, ZnO, Ni, Cu, Ag, ITO, Al, silica and graphene.

The mask layer 40 may be formed outside of the growth apparatus after growth of the first layer 30 having the protrusions 31 is completed. In another embodiment, the mask layer 40 may be directly formed inside of the semiconductor thin film growth apparatus according to selected substance. When the mask layer 40 is formed outside of the growth apparatus, the substance is freely selected and pattern formation is easy.

The mask layer 40 may be formed by a method such as plasma enhanced chemical vapor deposition (PECVD) or sputtering, but the embodiment of the present invention is not limited thereto.

For example, after the growth substrate provided with the grown first layer is taken out of the semiconductor growth apparatus, a silicon oxide film is deposited and is then etched to form a pattern, thereby forming the mask layer 40.

The mask layer 40 effectively prevents propagation of crystal defects generated on the upper surface of the substrate 10 and the first layer in an early growth stage. The mask layer 40 may be formed by a variety of methods.

The mask layer 40 may be formed by forming a dielectric film having a considerably small thickness of 1 to 10 nm and then etching the dielectric film. A porous thin film to expose a portion of the first layer 30 upward may be formed by etching the dielectric film.

When the mask layer 40 is ex-situ formed outside of the semiconductor growth apparatus, the mask layer 40 may be formed by forming a thin film to cover the upper surface of the first layer 30 using a dielectric material and then etching the thin film.

In another embodiment, the mask layer 40 may be formed in a nano-dot form through thermal treatment, a uniform unit structure array form and by a method using nano-scaled silica particles, but the embodiment of the present invention is not limited to the method.

Figure 14:
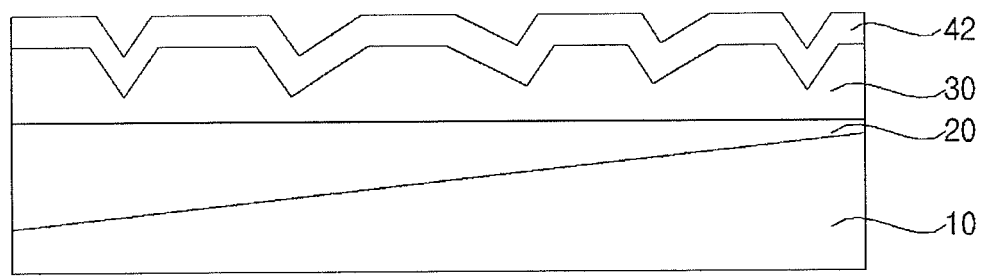
FIGS. 14 and 15 are sectional views showing formation of the mask layer according to an embodiment of the present invention.
Figure 15:
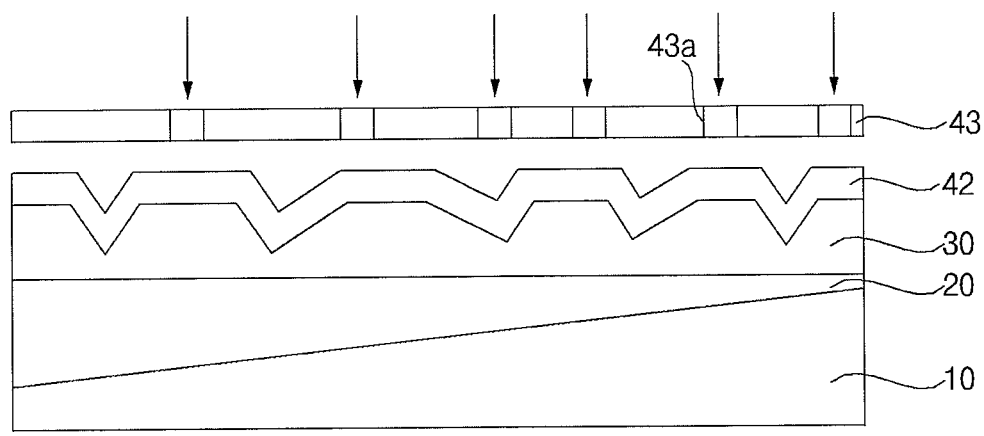

Next, FIGS. 14 and 15 are sectional views showing formation of the mask layer according to an embodiment. Referring to FIG. 14, in the method for manufacturing a growth substrate according to the embodiment, a dielectric thin film 42 may be formed on the first layer 30.

Referring to FIG. 15, in the method for manufacturing a growth substrate according to the embodiment, a pattern mask 43 having a plurality of holes 43a is disposed on the dielectric thin film 42 and the dielectric thin film 42 is etched to form the mask layer 40.

The pattern mask 43 may include a metal. For example, the pattern mask 43 may include nickel (Ni) or silver (Ag). The nickel (Ni) or silver (Ag) may be disposed as a thin metal film on the dielectric thin film 42. When the nickel (Ni) or silver (Ag) is thermally treated, it may be transformed into a nano-scale dot. The dielectric thin film 42 may be etched using the nickel (Ni) or silver (Ag) having a nano-scale dot shape as the pattern mask 43.

Figure 16:
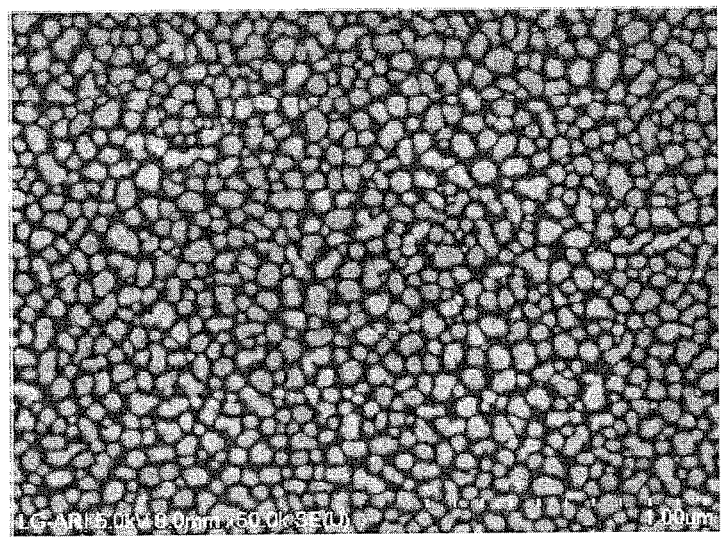
FIG. 16 is a micrograph showing a first example of formation of the mask layer according to an embodiment of the present embodiment.

FIG. 16 is a micrograph showing a first example of formation of the mask layer according to the present embodiment. Referring to FIG. 16, the shape like a particle represents the pattern mask 43 formed of Ni or Ag and the remaining part represents the dielectric thin film 42.

Figure 17:
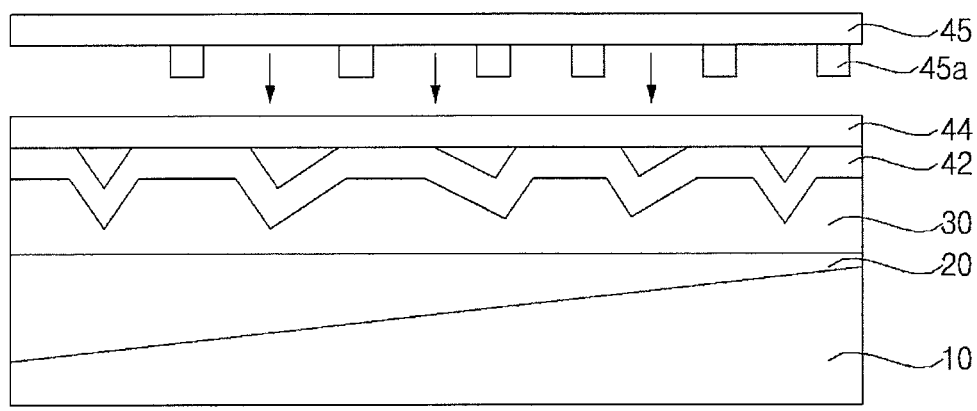
FIG. 17 is a sectional view illustrating a second example of formation of the mask layer according to the present invention.

FIG. 17 is a sectional view illustrating a second example of formation of the mask layer according to the present embodiment. Referring to FIG. 17, in the method for manufacturing a growth substrate according to the embodiment, a material such as a resist 44 is coated on the dielectric thin film 42, and the resist 44 is imprinted into a desired shape using a mold 45 having a plurality of protrusions 45a with a predetermined shape to form a pattern of the resist 44.

When the dielectric thin film 42 is etched using the resist 44 as the mask, the protrusion 45a of the mold 45 is transferred to the dielectric thin film 42 to form the mask layer 40.

Figure 18:
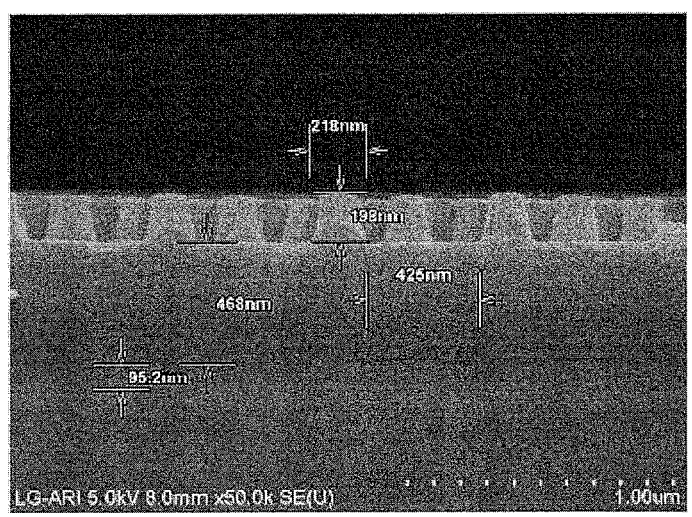
FIG. 18 is a micrograph illustrating a second example of formation of the mask layer according to an embodiment of the present invention.

FIG. 18 is a micrograph illustrating a second example of the formation of the mask layer according to the present embodiment. In FIG. 18, the image of the porous mask layer 40 formed by imprinting is shown.

Figure 19:
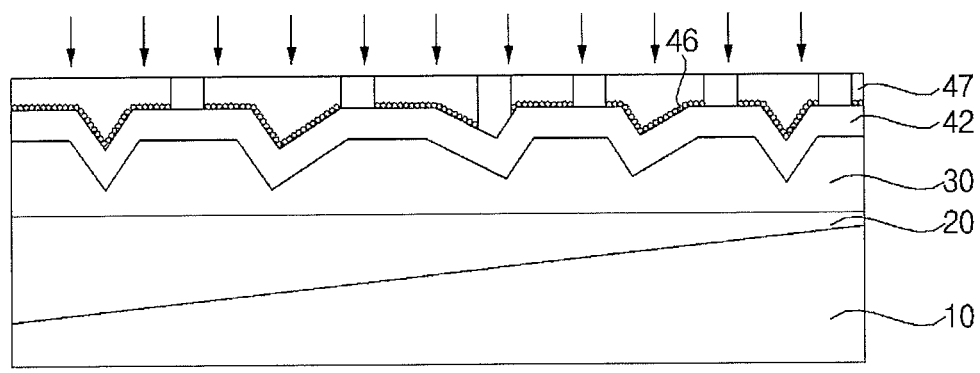
FIG. 19 is a sectional view illustrating a third example of formation of the mask layer according to an embodiment of the present invention.

FIG. 19 is a sectional view illustrating a third example of the formation of the mask layer according to the present embodiment. As shown in FIG. 19, in the method for manufacturing a growth substrate according to the embodiment, a pattern of the porous mask layer 40 may be formed using a nano-sphere.

For example, when a liquid 47 containing silica particles 46 such as silica nano-spheres is coated on the dielectric thin film 42, the silica particles 46 are adhered to the surface of the dielectric thin film 42.

Figure 20:
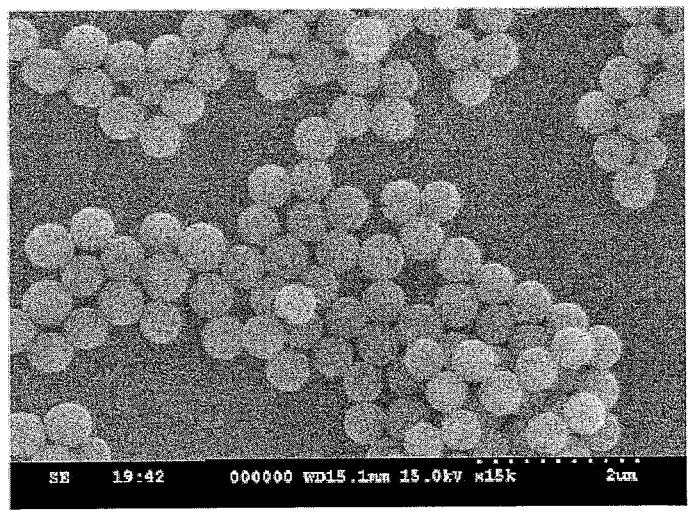
FIG. 20 is a micrograph illustrating a fourth example of formation of the mask layer according to an embodiment of the present invention.

FIG. 20 is a micrograph illustrating a fourth example of formation of the mask layer according to the present embodiment. FIG. 20 shows an image showing silica particles 46 adhered to the dielectric thin film 42. The dielectric thin film 42 is etched using the silica particles 46 as masks to form a dielectric layer 40.

In addition to the methods described above, a variety of methods may be used and the embodiment of the present invention is not limited to any method.

Figure 21:
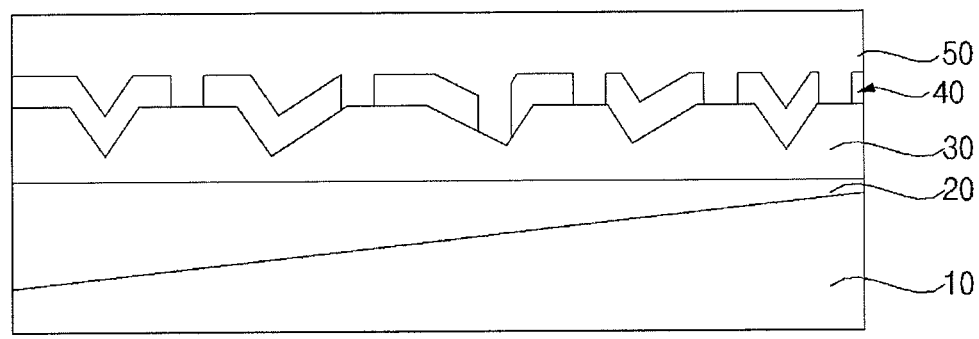
FIG. 21 is a sectional view illustrating a configuration in which a second layer is formed on a porous mask layer according to an embodiment of the present invention.

FIG. 21 is a sectional view illustrating a configuration in which a second layer is formed on the porous mask layer, according to an embodiment. Referring to FIG. 21, in the method for manufacturing a growth substrate, a second layer 50 may be formed on the first layer 30 provided with the mask layer 40 (S160). The second layer 50 may be grown on the upper surface of the first layer 30 in an open area of the porous structure of the mask layer 40.

When the thin film of the second layer 50 is continuously grown, the nitride semiconductor combines through thin film growth in a horizontal direction to form the second layer 50 having a flat surface.

The mask layer 40 and the second layer 50 form an air void between each other. An air void may be formed on a portion of the mask layer 40. For example, the air void may be formed when growth in a vertical direction is not performed on a portion of the mask layer 40.

The second layer 50 is formed on the growth surface having an angle of inclination from the R plane of the hexagonal system of the substrate 10, thus facilitating growth in a horizontal direction. The second layer 50 may extend between a plurality of mask layers 40.

The second layer 50 is grown between the mask layers 40 and minimizes a phenomenon in which defects generated in the first layer 30 pass through the mask layers 40 and rise up to the second layer 50. The second layer 50 is a high-quality thin film with considerably reduced crystal defects through the process described above. The second layer 50 has a crystal defect density much smaller than the first layer 30.

Figure 22:
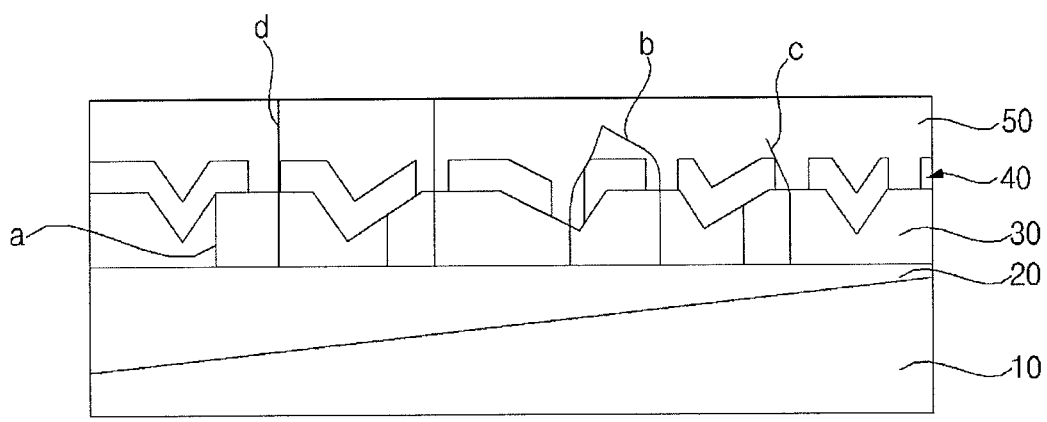
FIG. 22 is a schematic view illustrating propagation of dislocation of the growth substrate according to an embodiment of the present invention.

FIG. 22 is a schematic view illustrating propagation of dislocation of the growth substrate according to an embodiment.

As shown in FIG. 22, dislocations "a" having a first defect density are propagated upward along a first layer 30. The dislocations "a" may be partially blocked by the mask layer 40.

Dislocations "b" and "c" which are propagated, instead of blocking by the mask layer 40, are changed in a propagation direction by the protrusions 31. Some dislocations "b" contact each other and combine with each other, or other dislocations "c" are moved in a slant direction according to formation of the second layer 50 and then decay.

Propagation of the dislocations "b" and "c" to the growth surface of the second layer 50 may be blocked. The mask layer 40 and the protrusions 31 having an inclined surface induce combination or decay of crystal defects, thereby effectively reducing defects.

Figure 23:
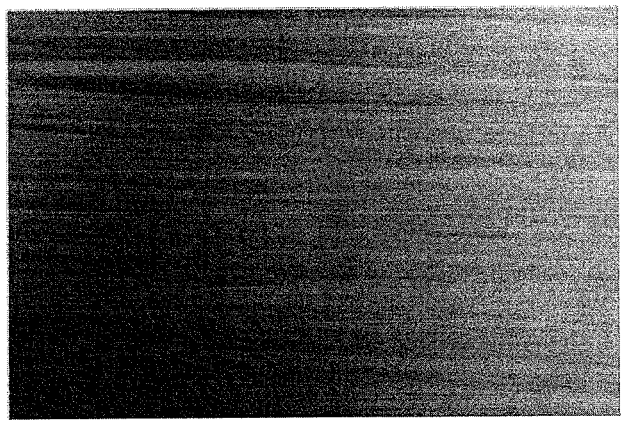
FIG. 23 is a micrograph illustrating surface morphology of the growth substrate according to an embodiment of the present invention.

FIG. 23 is a micrograph illustrating surface morphology of the growth substrate according to an embodiment. Referring to FIG. 23, a density of defects, present in the second layer 50, namely, second defect density, is greatly decreased than the first defect density.

A variety of semiconductor devices may be manufactured by growing a nitride semiconductor on the growth substrate according to the embodiment. The semiconductor device may be a light emitting device such as nitride light emitting diode or laser diode, a transistor device such as IGBT or HEMT, or the like.

Figure 24:
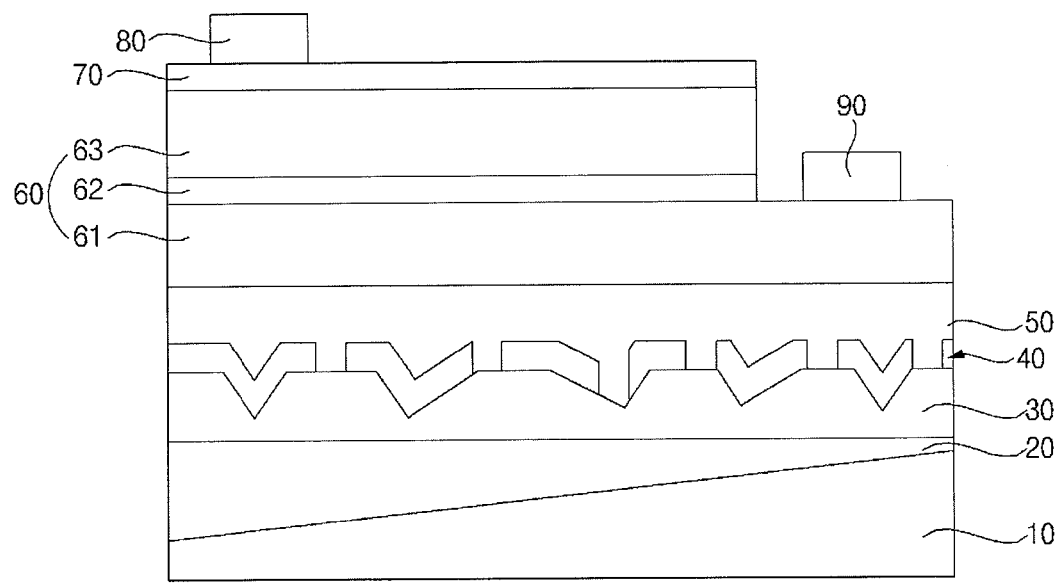
FIG. 24 is a sectional view illustrating one example of a light emitting device manufactured using the growth substrate according to an embodiment of the present invention.

FIG. 24 is a sectional view illustrating an example of a light emitting device manufactured using the growth substrate according to an embodiment. Hereinafter, a process for manufacturing a light emitting device such as light emitting diode on the growth substrate according to an embodiment will be described in brief.

Referring to FIG. 24, a light emitting structure 60 including a first semiconductor layer 61, an active layer 62 and a second semiconductor layer 63 are grown on the growth substrate according to the embodiment disposed on the second layer 50.

The first semiconductor layer 61 may be implemented with an n-type semiconductor layer and the n-type semiconductor layer may be, for example, formed of a semiconductor material having a formula of $In_xAl_yGa_{1-x-y}N$ ($0 \le x \le 1$, $0 \le y \le 1$, $0 \le x+y \le 1$), selected from gallium nitride (GaN), aluminium nitride (AlN), aluminium gallium nitride (AlGaN), indium gallium nitride (InGaN), indium nitride (InN), InAlGaN, and AlInN. The first semiconductor layer 61 may be, for example, doped with an n-type dopant such as silicon (Si), germanium (Ge), tin (Sn), selenium (Se) or tellurium (Te).

The active layer 62 may be formed on the first semiconductor layer 61. The active layer 62 may be formed as a double hetero junction structure, a single or multiple quantum well structure, a quantum-wire structure or a quantum dot structure or the like using a compound semiconductor material of Group III-V or Group II-IV elements.

When the active layer 62 is formed as a quantum well structure, the active layer 62 may have, for example, a single or multiple quantum well structure having a well layer having a formula of $In_xAl_yGa_{1-x-y}N$ ($0 \le x \le 1$, $0 \le y \le 1$, $0 \le x+y \le 1$) and a barrier layer having a formula of $In_aAl_bGa_{1-a-b}N$ ($0 \le a \le 1$, $0 \le b \le 1$, $0 \le a+b \le 1$). The well layer may be formed of a material having a smaller band gap than the barrier layer.

A conductive clad layer may be formed on and/or under the active layer 62. The conductive clad layer may be formed of a semiconductor having a wider band gap than the barrier layer of the active layer 62. For example, the conductive clad layer may include GaN, AlGaN, InAlGaN, a superlattice structure or the like. In addition, the conductive clad layer may be doped with an n-type or p-type dopant.

The second semiconductor layer 63 may be formed on the active layer 62. The second semiconductor layer 63 may be implemented with a p-type semiconductor layer doped with a p-type dopant. The second semiconductor layer 63 may be selected from semiconductor materials having a formula of $In_xAl_yGa_{1-x-y}N$ ($0 \le x \le 1$, $0 \le y \le 1$, $0 \le x+y \le 1$), for example, gallium nitride (GaN), aluminium nitride (AlN), aluminium gallium nitride (AlGaN), indium gallium nitride (InGaN), indium nitride (InN), InAlGaN, AlInN and the like, and may be doped with a p-type dopant such as magnesium (Mg), zinc (Zn), calcium (Ca), strontium (Sr) or barium (Ba).

The first semiconductor layer 61, the active layer 62 and the second semiconductor layer 63 may be formed by a method, for example, metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE) or the like, but the embodiment of the present invention is not limited thereto.

In the light emitting structure 60, concentrations of conductive dopants doped in the first semiconductor layer 61 and the second semiconductor layer 63 may be uniform or non-uniform, but the embodiment of the present invention is not limited thereto. An interlayer structure of the light emitting structure 60 may be varied, but the embodiment of the present invention is not limited thereto.

A transparent electrode layer 70 may be formed on the light emitting structure 60. A second electrode 80 may be disposed on the transparent electrode layer 70. The transparent electrode layer 70 may include at least one of ITO, IZO (In—ZnO), GZO (Ga—ZnO), AZO (Al—ZnO), AGZO (Al—Ga ZnO), IGZO (In—Ga ZnO), $IrO_x$, $RuO_x$, $RuO_x/ITO$, $Ni/IrO_x/Au$ and $Ni/IrO_x/Au/ITO$ and is formed on the second semiconductor layer 63 to prevent current crowding.

When the first semiconductor layer 61 is etched such that an upper surface thereof is exposed, and a first electrode 90 is then disposed on the upper surface of the first semiconductor layer 61, a horizontal light emitting diode as shown in FIG. 24 may be formed.

The first electrode 90 and the second electrode 80 may include a conductive material. For example, the first electrode 90 and the second electrode 80 may include a metal selected from In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi, or an alloy thereof and may be formed as a monolayer or a multilayer, but the embodiment of the present invention is not limited thereto.

Figure 25:
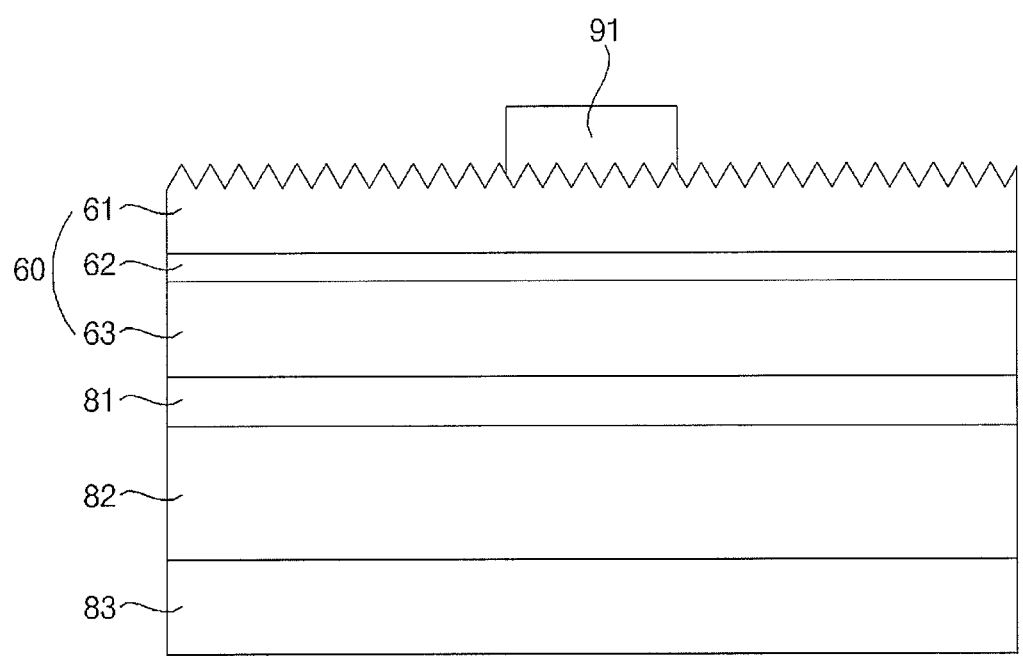
FIG. 25 is a sectional view illustrating another example of a light emitting device manufactured using the growth substrate according to an embodiment of the present invention.

FIG. 25 is a sectional view illustrating another example of a light emitting device manufactured using the growth substrate according to the embodiment of FIG. 24.

FIG. 25 illustrates a vertical light emitting diode manufactured using the growth substrate according to the embodiment. The vertical light emitting diode is formed by growing a light emitting structure 60 including a first semiconductor layer 61, an active layer 62 and a second semiconductor layer 63 on a growth substrate wherein an upper surface of a second layer 50 is disposed in an upper part.

Materials and methods for forming the light emitting structure 60 have been described with reference to FIG. 24 and a further detailed description is thus omitted.

A second electrode 81 may be disposed on the second semiconductor layer 63. The second electrode 81 may be bonded to a support layer 83 through a bonding layer 82. The support layer 83 may include a metal or a semiconductor.

In one embodiment, the support layer 83 may be formed of a semiconductor material. For example, the support layer 83 may be implemented with a carrier wafer such as silicon (Si), germanium (Ge), gallium arsenide (GaAs), zinc oxide (ZnO), silicon carbide (SiC), silicon germanium (SiGe), gallium nitride (GaN), or gallium (III) oxide ($Ga_2O_3$).

In another embodiment, the support layer 83 may be formed of a conductive material. The support layer 83 may be formed of a metal according to embodiments. For example, the support layer 83 may be formed of a metal selected from gold (Au), nickel (Ni), tungsten (W), molybdenum (Mo), copper (Cu), aluminum (Al), tantalum (Ta), silver (Ag), platinum (Pt) and chromium (Cr), or an alloy of two or more thereof, or may be formed by laminating two or more of the materials.

When the support layer 83 is formed of a metal, discharge of heat generated in the light emitting device is facilitated and thermal stability of the light emitting device is thus improved.

When the second electrode 81 is connected to the support layer 83, the first semiconductor layer 61 may be exposed when the growth substrate is removed. When the first electrode 91 is formed on the upper surface of the first semiconductor layer 61 exposed by removing the growth substrate, a vertical light emitting diode structure as shown in FIG. 25 may be formed.

The growth substrate according to the embodiments of the present invention has the following one or more advantages.

The growth substrate according to the embodiment includes a mask layer having a plurality of grooves disposed between a first layer and a second layer, and the mask layer prevents propagation of defects caused by difference in lattice constant between the first layer and the substrate, to an upper surface of the second layer.

Regarding the growth substrate according to the embodiment, the first layer has protrusions having an inclination, thereby collecting defects of the first layer caused by difference in lattice constant between the first layer and the substrate, in a horizontal direction of the upper surface of the substrate.

The growth substrate according to the embodiment is formed such that the upper surface thereof has an inclination with respect to an R plane of a hexagonal system. When the first layer and the second layer are formed on the upper surface of the growth substrate, the upper surface of the second layer is a flat surface having no irregularities. In a case in which a light emitting device is grown on the upper surface of the second layer, the light emitting device exhibits superior crystal qualities.

Regarding the growth substrate according to the embodiment, the upper surface of the growth substrate has an inclination with respect to the R plane of the hexagonal system growth, thereby growing the second layer while well distributing the same in a horizontal direction and minimizing generation of defects between mask layers formed on the protrusions.

Regarding the growth substrate according to the embodiment, the mask layer and the protrusions having an inclined surface induce combination or decay of crystal defects, thereby effectively reducing defects.

Regarding the growth substrate according to the embodiment, the upper surface of the substrate includes a plurality of steps, thereby minimizing total reflection of light and maximizing light extraction efficiency.

In addition, the light emitting device according to the embodiments may be applied without limitation of configuration and method of the embodiments mentioned above and may be configured in a selective combination of the entirety or part of respective embodiments.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present invention defined in the appended claims.

What is claimed is:
1. A growth substrate comprising:
a substrate having a growth surface including a plurality of steps inclining in a first direction;
a first layer disposed on the growth surface, the first layer including:
an A-plane or an M-plane in an upper part thereof, a plurality of protrusions having an inclined surface on an upper surface thereof, and
nitride;
a mask layer including a dielectric material and having at least a portion disposed on the protrusions; and
a second layer disposed on the mask layer and including nitride.

2. The growth substrate according to claim 1, wherein a width of an inclination direction of the steps of the substrate are uniform.

3. The growth substrate according to claim 1, wherein the substrate includes a material having a hexagonal system, and
wherein a virtual line connecting ends of the steps of the substrate forms an angle of inclination in a positive (+) direction from an R plane of the substrate.

4. The growth substrate according to claim 3, wherein the angle formed by the virtual line and the R plane of the substrate is 0.2° to 0.4°.

5. The growth substrate according to claim 1, wherein the mask layer and the second layer form an air void between each other.

6. The growth substrate according to claim 1, wherein the upper surface of the first layer and an upper surface of the second layer have an identical crystal plane.

7. The growth substrate according to claim 1, wherein the mask layer comprises at least one of a silicon nitride film, an aluminum nitride film, a silicon oxide film, $Al_2O_3$, $TiO_2$, HfO ZnO, Ni, Cu, Ag, ITO, Al, silica and graphene.

8. The growth substrate according to claim 1, wherein the mask layer has a nano-porous structure so that the first layer contacts with the second layer.

9. The growth substrate according to claim 1, wherein a width between the steps of the inclination direction is 30 to 200 nm.

10. The growth substrate according to claim 1, wherein the steps are formed based on atoms composing the substrate.

* * * * *